(12) United States Patent
Zhang et al.

(10) Patent No.: US 12,282,856 B2
(45) Date of Patent: Apr. 22, 2025

(54) SYSTEMS AND METHODS FOR MAGNETIC RESONANCE IMAGING STANDARDIZATION USING DEEP LEARNING

(71) Applicant: Subtle Medical, Inc., Menlo Park, CA (US)

(72) Inventors: Tao Zhang, Mountain View, CA (US); Enhao Gong, Sunnyvale, CA (US); Gregory Zaharchuk, Stanford, CA (US)

(73) Assignee: SUBTLE MEDICAL, INC., Menlo Park, CA (US)

( * ) Notice: Subject to any disclaimer, the term of this patent is extended or adjusted under 35 U.S.C. 154(b) by 380 days.

(21) Appl. No.: 18/058,658

(22) Filed: Nov. 23, 2022

(65) Prior Publication Data

US 2023/0162043 A1 May 25, 2023

Related U.S. Application Data

(63) Continuation of application No. 17/097,436, filed on Nov. 13, 2020, now Pat. No. 11,550,011, which is a
(Continued)

(51) Int. Cl.
*G06N 3/088* (2023.01)
*G01R 33/54* (2006.01)
(Continued)

(52) U.S. Cl.
CPC ............ *G06N 3/088* (2013.01); *G01R 33/54* (2013.01); *G06N 3/04* (2013.01); *G06T 7/0012* (2013.01);
(Continued)

(58) Field of Classification Search
CPC ........ G06N 3/088; G06N 3/04; G06V 10/764; G06V 10/82; G01R 33/54; G06T 7/0012; G06T 2207/10088; G06T 2207/20081
(Continued)

(56) References Cited

U.S. PATENT DOCUMENTS 9,721,340 B2 8/2017 Gillies et al.
10,127,659 B2 11/2018 Hsieh et al.
(Continued)

FOREIGN PATENT DOCUMENTS

WO WO-2019241659 A1 12/2019

OTHER PUBLICATIONS

Bahrami, Khosro, et al. "Reconstruction of 7T-like images from 3T MRI." IEEE transactions on medical imaging 35.9 (2016): 2085-2097.
(Continued)

*Primary Examiner* — Allen H Nguyen
(74) *Attorney, Agent, or Firm* — WILSON SONSINI GOODRICH & ROSATI

(57) ABSTRACT

A computer-implemented method for transforming magnetic resonance (MR) imaging across multiple vendors is provided. The method comprises: obtaining a training dataset, wherein the training dataset comprises a paired dataset and an un-paired dataset, and wherein the training dataset comprises image data acquired using two or more MR imaging devices; training a deep network model using the training dataset; obtaining an input MR image; and transforming the input MR image to a target image style using the deep network model.

20 Claims, 7 Drawing Sheets

Related U.S. Application Data continuation of application No. PCT/US2019/037235, filed on Jun. 14, 2019.

(60) Provisional application No. 62/685,774, filed on Jun. 15, 2018.

(51) Int. Cl.
  *G06N 3/04* (2023.01)
  *G06T 7/00* (2017.01)
  *G06V 10/764* (2022.01)
  *G06V 10/82* (2022.01)

(52) U.S. Cl.
  CPC ............ *G06V 10/764* (2022.01); *G06V 10/82* (2022.01); *G06T 2207/10088* (2013.01); *G06T 2207/20081* (2013.01)

(58) Field of Classification Search
  USPC .......................................................... 382/128
  See application file for complete search history.

(56) References Cited

U.S. PATENT DOCUMENTS

| | | | |
|---|---|---|---|
| 10,871,536 B2* | 12/2020 | Golden | G06N 3/084 |
| 11,550,011 B2 | 1/2023 | Zhang et al. | |
| 11,704,799 B2* | 7/2023 | Li | G16H 40/63 |
| 2015/0238148 A1 | 8/2015 | Georgescu et al. | |
| 2015/0347682 A1 | 12/2015 | Chen et al. | |
| 2016/0203599 A1 | 7/2016 | Gillies et al. | |
| 2017/0053064 A1 | 2/2017 | Bhavani | |
| 2017/0072222 A1 | 3/2017 | Siversson | |
| 2017/0200067 A1 | 7/2017 | Zhou et al. | |
| 2017/0337682 A1 | 11/2017 | Liao et al. | |
| 2017/0372193 A1 | 12/2017 | Mailhe et al. | |
| 2018/0061058 A1 | 3/2018 | Xu et al. | |
| 2018/0061059 A1 | 3/2018 | Xu et al. | |
| 2018/0144243 A1 | 5/2018 | Hsieh et al. | |
| 2018/0144244 A1 | 5/2018 | Masoud et al. | |
| 2018/0144465 A1 | 5/2018 | Hsieh et al. | |
| 2019/0049540 A1 | 2/2019 | Odry et al. | |
| 2019/0066268 A1 | 2/2019 | Song et al. | |
| 2019/0220977 A1 | 7/2019 | Zhou et al. | |
| 2019/0223725 A1 | 7/2019 | Lu et al. | |
| 2020/0090382 A1 | 3/2020 | Huang et al. | |
| 2020/0205745 A1 | 7/2020 | Khosousi et al. | |
| 2020/0342362 A1* | 10/2020 | Soni | G06N 3/044 |
| 2020/0394459 A1 | 12/2020 | Xu et al. | |
| 2021/0016109 A1 | 1/2021 | Sjolund | |
| 2021/0233239 A1 | 7/2021 | Li et al. | |
| 2021/0386391 A1 | 12/2021 | Karanam et al. | |
| 2022/0334208 A1 | 10/2022 | Tamir et al. | |

OTHER PUBLICATIONS

Extended European Search Report issued in European Application No. 19820086.7 on Feb. 11, 2022.

Gatys, L. et al. "Image style transfer using convolutional neural networks." Proceedings of the IEEE Conference on Computer Vision and Pattern Recognition. 2016.

Gong, et al. Creating Standardized MR Images with Deep Learning to Improve Cross-Vendor Comparability. Proceedings of the International Society for Magnetic Resonance in Medicine, ISMRM, Joint Annual Meeting ISMRM-ESMRMB, Paris, France, Jun. 16-21, 2018 (Pub Jun. 1, 2018), Jun. 1, 2018 (Jun. 1, 2008), XP055886218, Retrieved from the Internet: URL: https://index.mirasmart.com/ISMRM2018/PDFfiles/0357.html [retrieved on Feb. 1, 2022].

Johnson, J. et al., "Perceptual losses for real-time style transfer and super-resolution." European Conference on Computer Vision. Springer International Publishing, 2016.

Liu, Fang, et al. "Deep Learning MR Imaging-based Attenuation Correction for PET/MR Imaging." Radiology (2017): 170700.

PCT/US19/37235 International Search Report & Written Opinion dated Aug. 29, 2019.

U.S. Appl. No. 17/097,436 Notice of Allowance dated Nov. 17, 2022.

Xiao, et al. A deep convolutional network that accurately transforms between brain MRI contrasts. Proceedings of the International Society for Magnetic Resonance in Medicine, ISMRM, Joint Annual Meeting ISMRM-ESMRMB, Paris, France, Jun. 16-21, 2018 (PUB Jun. 1, 2018), No. 795, Jun. 1, 2018 (Jun. 1, 2018), XP040700003.

Zhang, et al. Separating Style and Content for Generalized Style Transfer. arxiv.org, Cornell University Library, 201 Olin Library Cornell University Ithaca, NY 14853, Nov. 17, 2017 (Nov. 17, 2017), 9 pages. XP080838067.

Zhu, Jun-Yan, et al. "Unpaired image-to-image translation using cycle-consistent adversarial networks." arXiv preprint arXiv:1703.10593 (2017).

* cited by examiner

SYSTEMS AND METHODS FOR MAGNETIC RESONANCE IMAGING STANDARDIZATION USING DEEP LEARNING

CROSS-REFERENCE TO RELATED APPLICATION

This application is a Continuation U.S. patent application Ser. No. 17/097,436, filed Nov. 13, 2020, which is a Continuation of International Patent Application No. PCT/US19/37235, filed Jun. 14, 2019, which claims priority to U.S. Provisional Application No. 62/685,774 filed on Jun. 15, 2018, each of which is incorporated herein in its entirety.

BACKGROUND

A common task for radiologists is to compare sequential imaging studies acquired on different magnetic resonance (MR) hardware systems. Because each manufacturer's images show different contrast or distortions due to different design considerations, this task can be challenging. Clinical imaging trials can be more challenging if multiple vendor scanners are involved. Therefore, it is desirable to transform MR images from the appearance of one vendor to another vendor, or to a standardized MR style.

SUMMARY

The present disclosure provides methods and systems are capable of transforming magnetic resonance (MR) images from the appearance of one vendor to another vendor, or to a standardized MR image form or style. For example, the provided methods and systems may preserve anatomical information while transforming the vendor specific contrast "style". Methods and systems of the present disclosure may lead to a universal or uniform MRI style which benefits patients by improving inter-subject reproducibility and accuracy of diagnoses, enabling quantifiable comparison, consistency, standardization, and allowing MRI to be more quantitative and standardized.

In one aspect of the invention, a computer-implemented method for transforming magnetic resonance (MR) imaging across multiple vendors may be provided, said method comprising: obtaining a training dataset, wherein the training dataset comprises a paired dataset and an un-paired dataset, and wherein the training dataset comprises image data acquired using two or more MR imaging devices: training a deep network model using the training dataset: obtaining an input MR image; and transforming the input MR image to a target image style using the deep network model.

Additional aspects of the invention may be directed to a non-transitory computer-readable storage medium including instructions that, when executed by one or more processors, cause the one or more processors to perform operations comprising: obtaining a training dataset, wherein the training dataset comprises a paired dataset and an un-paired dataset, and wherein the training dataset comprises image data acquired using two or more MR imaging devices: training a deep network model using the training dataset: obtaining an input MR image; and transforming the input MR image to a target image style using the deep network model.

Additional aspects and advantages of the present disclosure will become readily apparent to those skilled in this art from the following detailed description, wherein only illustrative embodiments of the present disclosure are shown and described. As will be realized, the present disclosure is capable of other and different embodiments, and its several details are capable of modifications in various obvious respects, all without departing from the disclosure. Accordingly, the drawings and descriptions are to be regarded as illustrative in nature, and not as restrictive.

INCORPORATION BY REFERENCE

All publications, patents, and patent applications mentioned in this specification are herein incorporated by reference to the same extent as if each individual publication, patent, or patent application was specifically and individually indicated to be incorporated by reference.

BRIEF DESCRIPTION OF THE DRAWINGS

The novel features of the invention are set forth with particularity in the appended claims. A better understanding of the features and advantages of the present invention will be obtained by reference to the following detailed description that sets forth illustrative embodiments, in which the principles of the invention are utilized, and the accompanying drawings (also "Figure" and "FIG." herein) of which:

DETAILED DESCRIPTION

Figure 1:
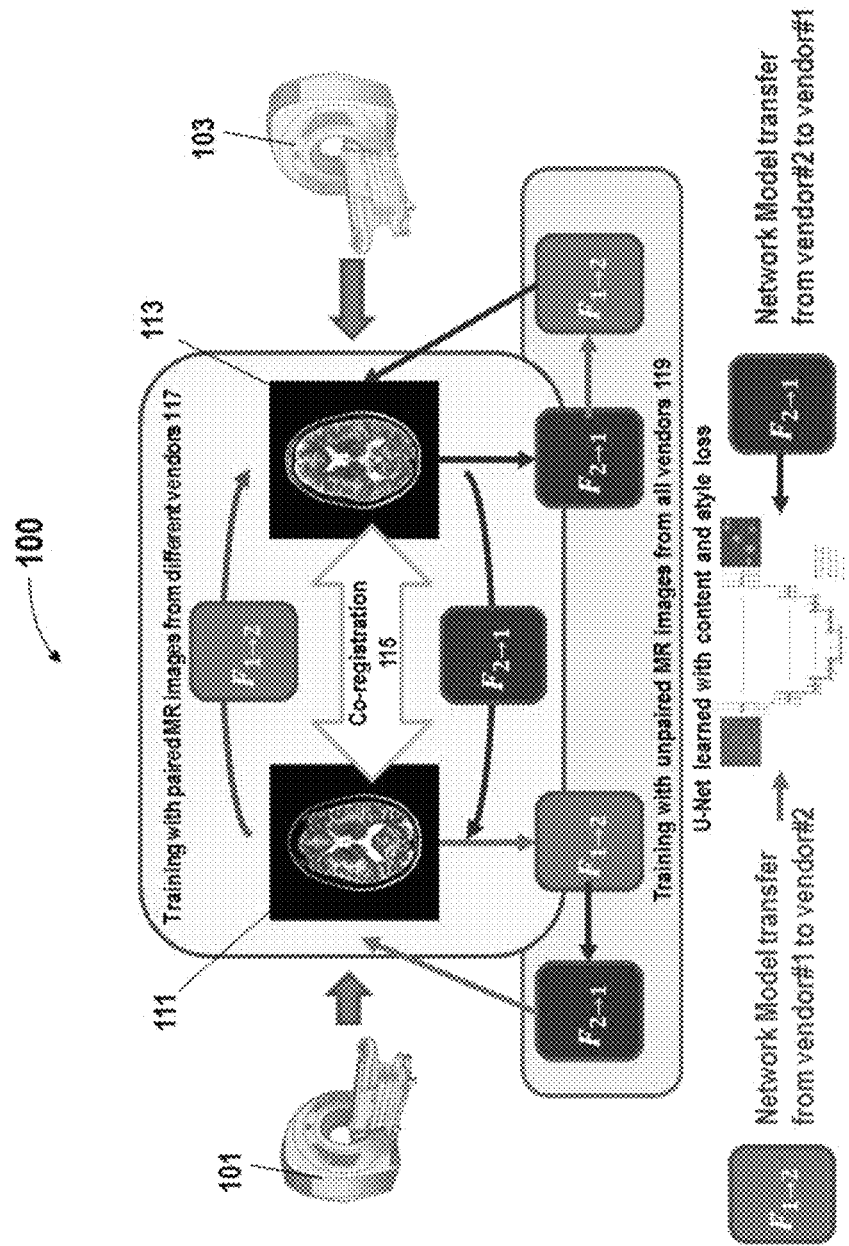
FIG. 1 schematically illustrates a system for providing standardized MR images based on deep learning.

While various embodiments of the invention have been shown and described herein, it will be obvious to those skilled in the art that such embodiments are provided by way of example only. Numerous variations, changes, and substitutions may occur to those skilled in the art without departing from the invention. It should be understood that various alternatives to the embodiments of the invention described herein may be employed.

Recognized herein is a need for transforming magnetic resonance (MR) images from the appearance of one vendor to another vendor, or to a standardized MR style. Methods and systems of the presenting disclosure may be capable of transforming MR images taken from different MR scanners into a synthesized or standardized form. The synthesized or standardized form may be a target form with pre-determined characteristics such as contrast, resolution, image size, color, skewness, distortion, orientation, and the like. Alternatively or in addition to, the target form may be consistent with the form or style of images taken by a selected scanner (provided by a selected vendor). In some cases, different MR scanners or MR imaging devices may be of different types provided by the same and/or different vendors. In some cases, different MR scanners or MR imaging devices may have different settings or hardware designs/configurations such that the corresponding MR images may be different in at least one of contrast, resolution (e.g., thickness size, pixel size, etc) and image distortion.

As used herein, the terms "style", "image style" and "form" may refer to the appearance of an image which can be used interchangeably throughout the specification.

Methods and systems disclosed herein may provide improved accuracy of cross-vendor transforms for contrast-weighted MRI. The provided methods and systems may use deep learning methods trained with multi-vendor datasets. The provided technique can significantly improve clinical workflow of comparing sequential scans taken on different scanners. This method may further improve quantifying biomarkers, co-registration and segmentation across images collected longitudinally. It is an essential component pushing MR imaging to be a standardized and quantitative imaging modality.

Methods disclosed herein may provide an algorithm, by training on both co-registered paired datasets from the same subject and further enhancing with un-paired training using Cycle Generative Adversarial Network (Cycle-GAN), results in accurate cross-vendor transformation. The provided methods and systems may be capable of standardizing the contrast-weighted MRI images into the same contrast standard, which enable easier longitudinal and cross-sectional analysis and comparison. Such an application is essential and valuable for clinical radiologists to monitor and staging disease progress. Also with normalized image contrasts, this technology can also be used to improve the tasks such as quantifying biomarkers, co-registration and segmentation.

High quality medical image datasets can be rare. Paired and co-registered cross-vendor images from the same subject can be even harder to collect. The provided method may utilize un-paired training approach allowing the deep learning method to train and apply on existing larger datasets that are already available in clinical database.

In addition, method disclosed herein may further allow MRI to be a more standardized and quantitative imaging modality with better quantification and repeatability. It is also a complementary technology to direct parameter mapping techniques (e.g., MRF) and achieve standardized imaging directly from routine MRI sequences. Methods or systems of the represent disclosure can be applied to other modalities such as positron emission tomography (PET). X-ray, computed tomography (CT) and ultrasound, when image standardization across imaging devices of different types, setups or configurations is desired.

FIG. 1 schematically illustrates a system 100 using deep learning to provide standardized MR images. The system 100 may be capable of training a network model for cross-vendor transformation and standardization. The system 100 may train the network model by training on both co-registered paired datasets from the same subject and further enhancing with un-paired training using Cycle-GAN, results in accurate cross-vendor transformation. The provided methods and systems may be capable of standardizing the contrast-weighted MRI images into the same contrast standard, which enable easier longitudinal and cross-sectional analysis and comparison. The network model may be used to transform MR image data acquired by one or more MR scanners or MR imaging devices to a target style. The original MR image data and the target image may be different in at least one of the following: contrast, resolution and image distortion. In some cases, the MR image may be acquired by different MR scanners or MR imaging devices 101, 103 that may be of different types provided by the same and/or different vendors. In some cases, the different MR scanners or MR imaging devices 101, 103 may have different settings, hardware designs, or configurations such that the corresponding MR images may be different in at least one of contrast, resolution and image distortion.

Deep Learning Approach

During the image transformation, a deep learning algorithm may be applied to the original image to estimate a function $f$ that transforms the original image $m_a$ of any form or style to the target image $\tilde{m}$. The target image may conform to a synthesized or standard form. As described above, the standardized form (i.e., target form) may have pre-determined characteristics such as contrast, resolution (e.g., thickness size, pixel size, etc), image size, color, skewness, distortion, orientation, or other characteristics. Alternatively or in addition to, the target form may be consistent with the form or style of MR images taken by a selected scanner (provided by a selected vendor). Define $\tilde{m}$ as the target image, then the transformation from image of any form or style $m_a$ to the target image m can be formulated as:

$$\tilde{m} = f(m_a),$$

where $f$ represents the image transformation from any style to a standard style. In some cases, this function $f$ may be obtained by optimizing metrics g between the ground-truth image m and the estimated image $\tilde{m}$ through a training process on a number of training datasets:

$$\min \Sigma g_i(k(m), k(\tilde{m})),$$

$$s.t. \; \tilde{m} = f(m_a)$$

There can be one or more cost metrics which can be combined with optimized weightings. g can be any suitable metrics such as $l_2$ norm $\|k(m)-k(\tilde{m})\|_2$, $l_1$ norm $\|k(m)-k(\tilde{m})\|_1$, structural dissimilarity, structural similarity loss, perceptual loss or other metrics. In some cases, k can be identity transform then the metrics are calculated in the image domain. k can be any other transforms, such as Fourier transform, therefore the metrics may be calculated in the corresponding frequency domain. In some cases, the g metric may be used as criteria during the training process of the deep learning model. In some cases, the g metrics can also be a network model that is separately or simultaneously trained together with $f$, to discriminate image states and evaluate image quality.

Similarly, the network model may estimate a function that transforms MR image acquired by one scanner provided by a first vendor to images having a style consistent with a second vendor. Define $m_1$ as the image 111 from the acquisition performed by the first scanner 101, $m_2$ as the image 113 having a form or style from the acquisition performed by the second scanner 103, then the transformation from $m_1$ to $m_2$ can be formulated as:

$$m_2 = f_{1 \to 2}(m_1),$$

Similarly, the transformation from $m_2$ to $m_1$ can be formulated as:

$$m_1 = f_{2 \to 1}(m_2),$$

where $f_{1 \to 2}$ and $f_{2 \to 1}$ represent the corresponding image transformation respectively.

The provided methods and systems may train a neural network model for transforming the MR image data. In some cases, the neural network may use U-net neural network structures, which have been widely used for medical tasks such as segmentations and image enhancement. The U-net neural network structures may be used in this network for image-to-image regression tasks.

The neural network may employ any type of neural network model, such as a feedforward neural network, radial basis function network, recurrent neural network, convolutional neural network, deep residual learning network and the like. In some embodiments, the machine learning algorithm may comprise a deep learning algorithm such as convolutional neural network (CNN). Examples of machine learning algorithms may include a support vector machine (SVM), a naïve Bayes classification, a random forest, a deep learning model such as neural network, or other supervised learning algorithm or unsupervised learning algorithm. In some cases, the method may be a supervised deep machine learning method, an unsupervised deep machine learning method or a combination of both.

The deep learning network such as CNN may comprise multiple layers. For example, the CNN model may comprise at least an input layer, a number of hidden layers and an output layer. A CNN model may comprise any total number of layers, and any number of hidden layers. The simplest architecture of a neural network starts with an input layer followed by a sequence of intermediate or hidden layers, and ends with output layer. The hidden or intermediate layers may act as learnable feature extractors, while the output layer in this example provides MR images conforming to a target style or form.

Each layer of the neural network may comprise a number of neurons (or nodes). A neuron receives input that comes either directly from the input data (e.g., image data taken on one or more scanners of different types) or the output of other neurons, and performs a specific operation, e.g., summation. In some cases, a connection from an input to a neuron is associated with a weight (or weighting factor). In some cases, the neuron may sum up the products of all pairs of inputs and their associated weights. In some cases, the weighted sum is offset with a bias. In some cases, the output of a neuron may be gated using a threshold or activation function. The activation function may be linear or non-linear. The activation function may be, for example, a rectified linear unit (ReLU) activation function or other functions such as saturating hyperbolic tangent, identity, binary step, logistic, arcTan, softsign, parameteric rectified linear unit, exponential linear unit, softPlus, bent identity, softExponential, Sinusoid, Sinc, Gaussian, sigmoid functions, or any combination thereof.

The deep learning network models may be trained both on paired datasets and on un-paired datasets which beneficially provides flexibility in data collection. The training datasets may comprise paired datasets including a reference image of a target style and an original image, and un-paired datasets which may include image data acquired by a plurality of scanners or imaging apparatuses of different types.

In some cases, the paired datasets may be used in supervised training. In some embodiments, the training process of the deep learning model may employ a residual learning method. In some instances, the residual learning framework may be used for evaluating a trained model. In some instances, the residual learning framework with skip connections may generate estimated ground-truth images from the original images such as MR image taken on a given scanner (provided by a given vendor), with refinement to ensure it is consistent with measurement (data consistency). In some cases, what the model learns is the residual of the difference between the original image data and ground-truth/target image data, which is sparser and less complex to approximate using the network structure. The method may use by-pass connections to enable the residual learning. In some cases, a residual network may be used and the direct model output may be the estimated residual/error between the original image and the target image. In other word, the function to be learned by the deep learning framework is a residual function which in some situations may be easy to optimize. The target image can be recovered by adding the original image to the residual. This residual training approach may reduce the complexity of training and achieve better performance where the output level is small.

In some cases, the deep learning model may be trained with adaptively tuned parameters based on user input and real-time estimated output images. Alternatively or in addition to, the deep learning network may be a "plain" CNN that does not involve residual learning. In some cases, during the training process, the deep learning model may adaptively tune model parameters to approximate the reference image of target style from an initial set of the input images, and outputting an image of the target style.

In the super-vised training based on MR image data, the cost function may need to be able to identify the differences between 3D voxels or 2D images. The paired dataset may be pre-processed to reduce the displacement or offset of corresponding pixels/voxels of in the paired data so that the cost function or loss function such as L1 loss (i.e., mean absolute error), L2 loss (i.e., mean square error), structural similarity loss, or perceptual losses can applied. For example, in order to compute similarity or differences estimation for supervised learning, image/volume co-registration algorithms may be applied to generate spatially matched images/volumes. In some cases, the co-registration algorithms may comprise a coarse scale rigid algorithm to achieve an initial estimation of an alignment, followed by a fine-grain rigid/non-rigid co-registration algorithm. In some cases, the supervised losses may be pixel-wise L1 and/or L2 losses. Alternatively or in addition to, the supervised losses may be voxel-wise loss, sub-image-wise losses or others.

In some cases, a network model trained based on paired datasets may be further enhanced using un-paired datasets. In some cases, a supervised learning and unsupervised learning may be performed sequentially. In some situations unsupervised algorithms may introduce instability during training. To avoid such instability, it is beneficial to train a model using supervised training with paired datasets then further enhance the model using unsupervised learning. For example, the model may be initially trained to estimate a transformation between different contrast styles using supervised losses such as pixel-wise L1 and/or L2 losses. The performance of the resulting model may not be good enough due to limitation of the supervised losses and the amount of available paired dataset. The model may be further improved by unsupervised learning or a combination of unsupervised and supervised learning. For example, the model can be further refined or enhanced using refinement losses such as a mixed loss of supervised losses (e.g., L1 loss, L2 loss, Lp loss, structural similarity, perceptual losses, etc) and unsupervised losses (e.g., GAN (Generative Adversarial Network) loss, least-square GAN, WGAN losses (Wasserstein GAN), etc).

There may be multiple iterations in a training process. In each of the multiple iterations, different supervised losses, unsupervised losses or combinations of supervised losses and unsupervised losses may be selected. Below lists examples of loss functions that may be involved in an exemplary training process to optimize the transform network $f_{2 \to 1}$ and $f_{1 \to 2}$, with co-registration $\phi$ align volume/image $m_1$ to volume/image $m_2$:

$$\hat{m_2} = f_{1\to 2}(\phi)(m_1))$$

$$\hat{m_1} = f_{2\to 1}(\phi)^{-1}(m_2))$$

$$\text{Loss}_{final} = \text{Loss}_{supervised} + \text{Loss}_{unsupervised}$$

$$\text{Loss}_{supervised} = \sum\nolimits_{supervised\ loss\ p} w_p L_p(\hat{m_1}, m_1) + w'_p L_p(\hat{m_2}, m_2)$$

$$\text{Loss}_{unsupervised} = w_{cycle}\text{Loss}_{cycle-GAN} + \text{Loss}_{GAN}$$

$$\text{Loss}_{cycle-GAN} = L_p(f_{2\to 1}(f_{1\to 2}(m_1)), m_1) + L_p(f_{1\to 2}(f_{2\to 1}(m_2)), m_2)$$

$$\text{Loss}_{GAN} = L_2(D(\hat{m_2})) + L_2((D(m_2) - 1)^2)$$

$$\min_D V_{LSGAN}(D) =$$

$$\frac{1}{2} E_{x\sim pdata(m_2)}[(D(m_2) - 1)^2] + \frac{1}{2} E_{\hat{m_2}\sim p\hat{m_2}(\hat{m_2})}[(D(G(z)))^2]$$

$$\min_G V_{LSGAN}(G) = \frac{1}{2} E_{\hat{m_2}\sim p\hat{m_2}(\hat{m_2})}[(D(G(z)) - 1)^2]$$

The training process may involve supervised and unsupervised learning techniques that can be applied sequentially or concurrently. The un-paired datasets may be used for unsupervised training which enables the method to further train and apply on most or all existing large scale MRI datasets. In some cases, the system 100 and/or methods may employ Cycle Generative Adversarial Network (Cycle-GAN) that further enables improved performance and more flexible training on both paired datasets and un-paired datasets. A Cycle-GAN may be used in adversarial training in which a discriminative network is used to enhance the primary network. The primary network may be generative (segmentation, synthesis) or discriminative (classification). With the adversarial training, the deep learning neural network model may be learnt with content and style loss. The content loss may be used to ensure the consistency of anatomical information over the image transformation. The content loss can be quantified using supervised voxel-wise losses or pixel-wise losses such as L1 loss, L2 loss, structural similarity, perceptual losses or others as described elsewhere herein. The style loss may be used to ensure the output result preserve the designed contrast visual quality, which can be estimated using the statistic of features from selected networks, such as the histogram of the activation in selected layer of the network. In some cases, the adversarial loss of the discriminator can be a type of style loss to estimate the style of the image by learning to predict if output result has the desired image visual quality. The machine learnt network may further be configured as a U-net. The U-net is an auto-encoder in which the outputs from the encoder-half of the network are concatenated with the mirrored counterparts in the decoder-half of the network. The U-net may replace pooling operations by upsampling operators thereby increasing the resolution of the output.

In some cases, the training process of the deep learning model may employ a patch-based approach. In some cases, the paired datasets may be divided into patches. For example, a pair of training images such as a pair of original image and target image may each be divided spatially into a set of smaller patches. The high quality image and the lower quality image can be divided into a set of patches. A size of an image patch may be dependent on the application such as the possible size a recognizable feature contained in the image. Alternatively, the size of an image patch may be pre-determined or based on empirical data.

The trained deep learning model may be used for transforming input data comprising MR image data of any style (e.g., taken on a first scanner) or different styles (e.g., taken on scanners of different types) to target data having a target style. In some cases, the input data may be 3D volume comprising multiple axial slices. In an example, an input and output slices may be complex-valued images of the same or different size, resolution, contrast or other characteristics. With aid of the provided system, automated MR image standardization may be achieved.

Example Datasets

In an example, datasets were collected and included co-registered multi-vendor MRI datasets from 7 subjects on different 3T scanners (GE MR750, Philips Ingenia, Siemens Skyra). There are co-registered datasets on 3 subjects collected with similar settings using both GE MR750 and Philips Ingenia, while another 4 subjects collected using both GE MR750 and Siemens Skyra. Additionally, there are 25 un-co-registered samples from different subjects that can be used for unpaired training with Cycle-GAN to ensure robust training and avoid over-fitting.

In the example, the performance of standardizing common contrast-weighted sequences is examined: 1) Axial-2D-T1w, 2) Axial-2D-T2w, 3) Axial-2D-GRE and 4) Sagittal-3D-T1-FLAIR. For each dataset, there are around 28~32 slices for 2D images and around 200~300 planes for high resolution 3D images.

Evaluation

Evaluation on contrast standardization results on the series for T1w, T2w, GRE and FLAIR is performed. In an example, the evaluation metrics may include, but not limited to, Peak-Signal-to-Noise-Ratio (PSNR), normalized Root-Mean-Squared-Error (RMSE) and Structural Similarity Index (SSIM). The real acquired images on different scanners are compared with the results of cross-vendor transforms.

Results

Figure 2:
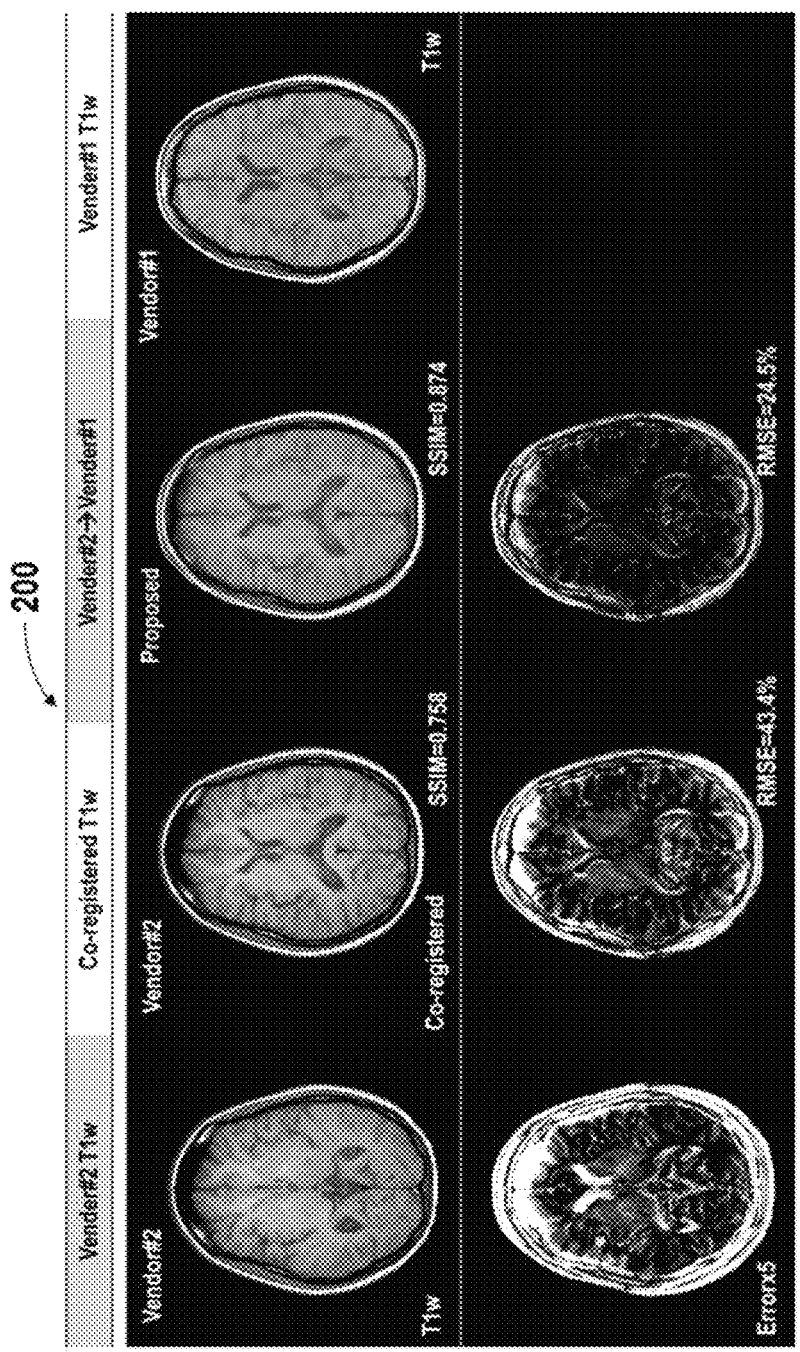
FIG. 2 shows an example of cross-vendor transformation.

FIG. 2 shows an example of cross-vendor transformation 200. As shown in the example, accurate cross-vendor transformation (T1w, vendor #2 to vendor #1 shown as example) is generated by the provided method or system. The inter-vendor differences between the two images are reduced after transformation while preserving the diagnostic quality as well as original anatomical information from the acquired T1w image.

Figure 3:
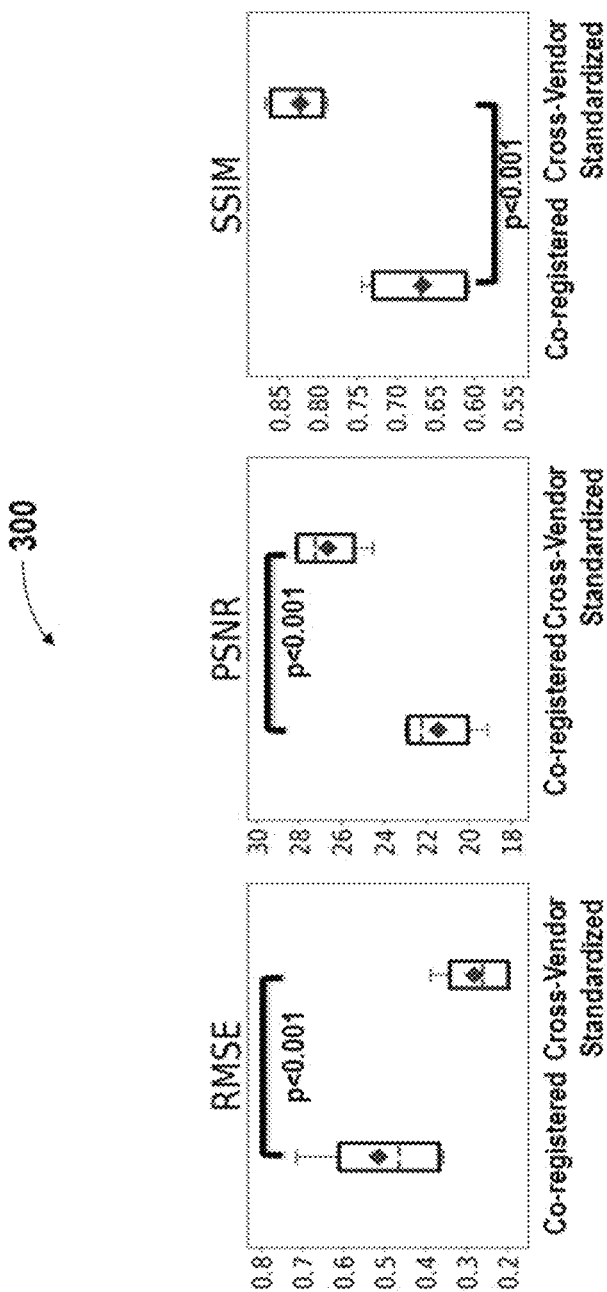
FIG. 3 shows a result generated using the methods and systems of the present disclosure.

A fast and accurate inference may be achieved using the network model trained in a processed as described above. As shown in FIG. 3, the similarity metrics 300 (average statistics for T1w, T2w and GRE) improves significantly (p<0.0001) by using the proposed cross-vendor standardization: over 5.0 dB PSNR gain, around 30% reduction in RMSE and over 0.15 improvements for SSIM.

Figure 4:
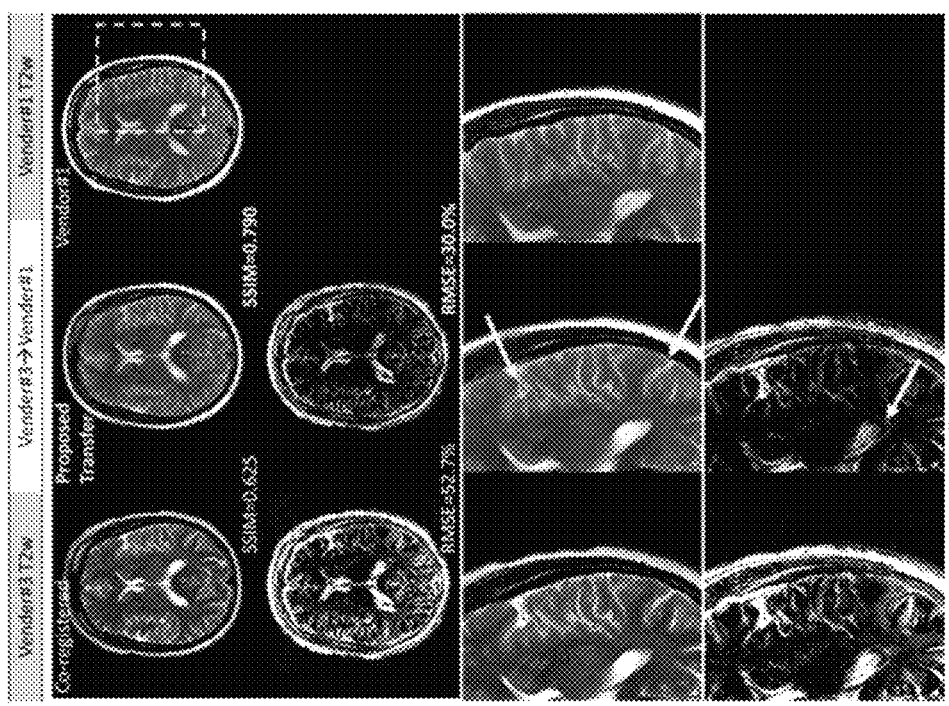
FIG. 4 and FIG. 5 show comparison of residual errors of the cross-vendor transformation result.
Figure 5:
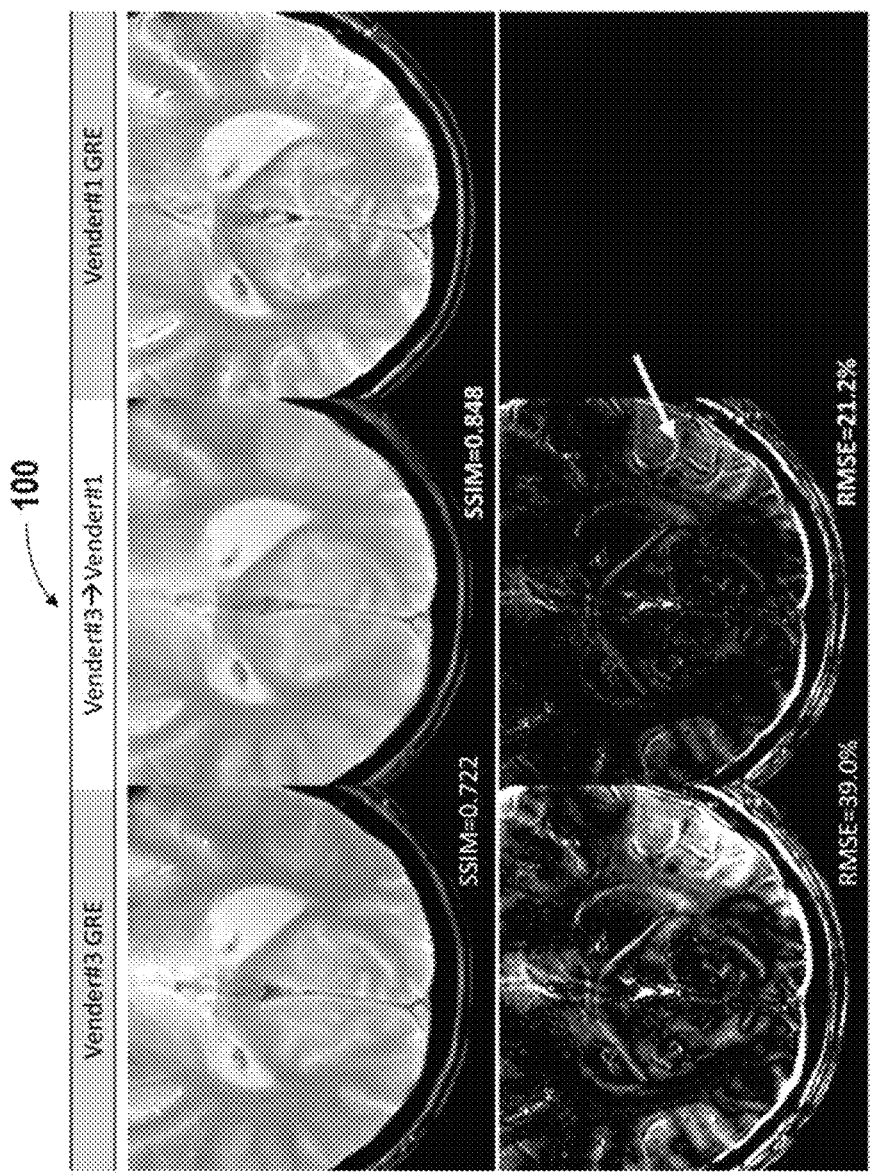

FIG. 4 and FIG. 5 further compare the detailed residual errors of cross-vendor transformation (T2w, GRE, vendor #3 to vendor #1) with zoom-in visualizations of the results and errors.

From the comparison, it is shown that the provided algorithm, by training on both co-registered paired datasets from the same subject and further enhancing with un-paired training using Cycle-GAN, results in accurate cross-vendor transformation. The provided system and method may be capable of standardizing the contrast-weighted MRI images into the same contrast standard, which enable easier longitudinal and cross-sectional analysis and comparison. Such an application is essential and valuable for clinical radiologists to monitor and staging disease progress. Also with normalized image contrasts, this technology can also be used to improve the tasks such as quantifying biomarkers, co-registration and segmentation.

Systems and methods of the present disclosure may provide an MR imaging standardization system that can be implemented on any existing MR imaging system without a need of a change of hardware infrastructure. The MR imaging standardization system may be implemented in software, hardware, firmware, embedded hardware, stand-alone hardware, application specific-hardware, or any combination of these. The MR imaging standardization system can be a standalone system that is separate from the MR imaging system. Alternatively or in addition to, the MR imaging standardization system can be integral to an existing MR imaging system such as a component of a controller of the MR imaging system.

Methods and systems of the present disclosure can be implemented by way of one or more algorithms. An algorithm can be implemented by way of software upon execution by the central processing unit. For example, some embodiments use the algorithm illustrated in FIG. 1 and FIG. 5 or other algorithms provided in the associated descriptions above.

Figure 6:
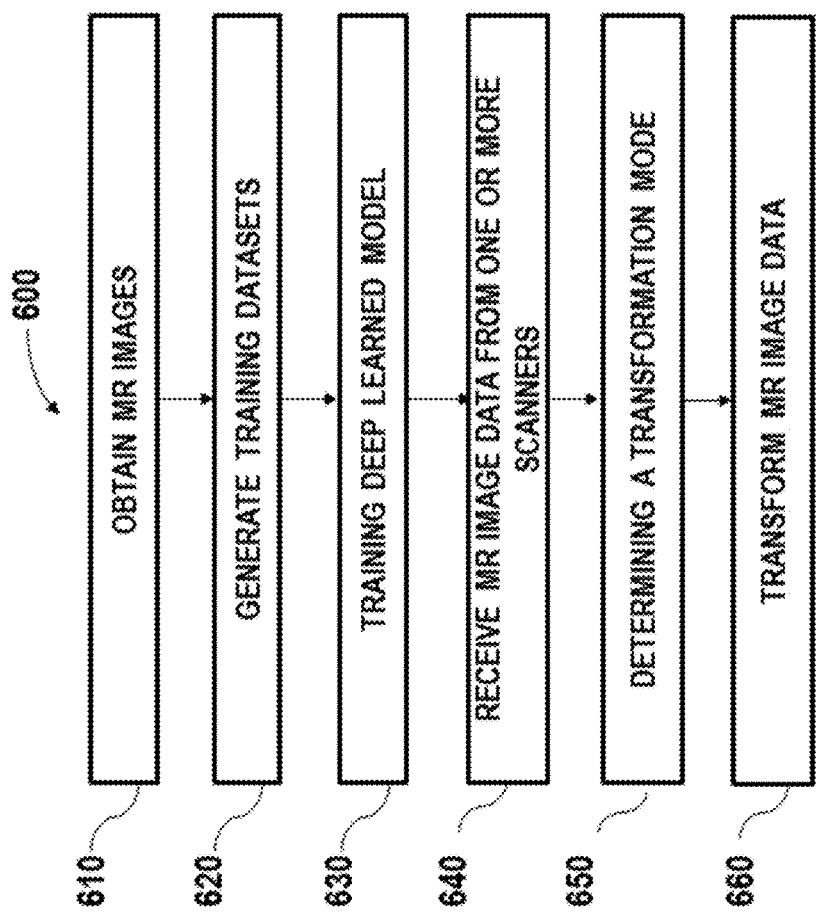
FIG. 6 illustrates an example of method for transforming MR image data of one or more styles to image data of a target style.

FIG. 6 illustrates an example of method 600 for transforming MR image data of one or more styles to image data of a target style. MR images may be obtained from one or more MR imaging devices/scanners (operation 610) for training a deep learning model. The one or more scanners may be of different types, different hardware designs, different configurations, or be provided by different vendors. The MR images may be used to form training datasets (operation 620). The training dataset may comprise paired datasets and un-paired datasets. The paired datasets may comprise co-registered MR image data acquired by different scanners or are of different styles. The paired datasets may include a reference image of a target style and an original image. The reference image of a target style can be MR image taken by a selected scanner (provided by a selected vendor). The reference image of a target style may be consistent with a standard form. The reference image may be synthesized image that is generated from raw image data by transforming it to a standard style. As described elsewhere herein, a target style may specify one or more characteristics selected from the group consisting of contrast, resolution, image distortion, skewness, color, size or other items.

The training step 630 may comprise a deep learning algorithm consistent with the disclosure herein. The deep learning algorithm may be a convolutional neural network, for example. In some cases, the deep learning algorithm may be a deep residual learning network. In some cases, the deep learning algorithm may use Cycle Generative Adversarial Network (Cycle-GAN) for training on un-paired datasets.

The network model may then be used for transforming a MR image of any style to a target style. The MR image may be acquired by one or more scanners that may be of the same or different types (operation 640). In an optional step, a transformation mode may be determined (operation 650). The transformation mode may define the target style/form and/or one or more characteristics (e.g., contrast, resolution, image distortion, skewness, color, size) of a target style/form. A transformation mode may be determined automatically or manually. In some cases, a target style may be pre-determined or pre-selected and automatically loaded to the system. Alternatively or in addition to, a user may be permitted to select a target style or specify one or more characteristics of a target style. For example, a user may input, via a user interface, a target style. The target style may be provided via any suitable formats on a GUI, such as a selection from drop-down menu (e.g., standard style, a vendor list, etc), direct input in a search field (e.g., input name of a vendor) or via other suitable means such as voice command and the like. Upon determination of a target style, the corresponding network model may be selected and the corresponding transformation is performed on the input MR image (operation 660). In some cases, the network model may be retrieved from a database that is in communication with the system.

Although FIG. 6 shows a method in accordance with some embodiments a person of ordinary skill in the art will recognize that there are many adaptations for various embodiments. For example, the operations can be performed in any order. Some of the operations may be precluded, some of the operations may be performed concurrently in one step, some of the operations repeated, and some of the operations may comprise sub-steps of other operations.

Figure 7:
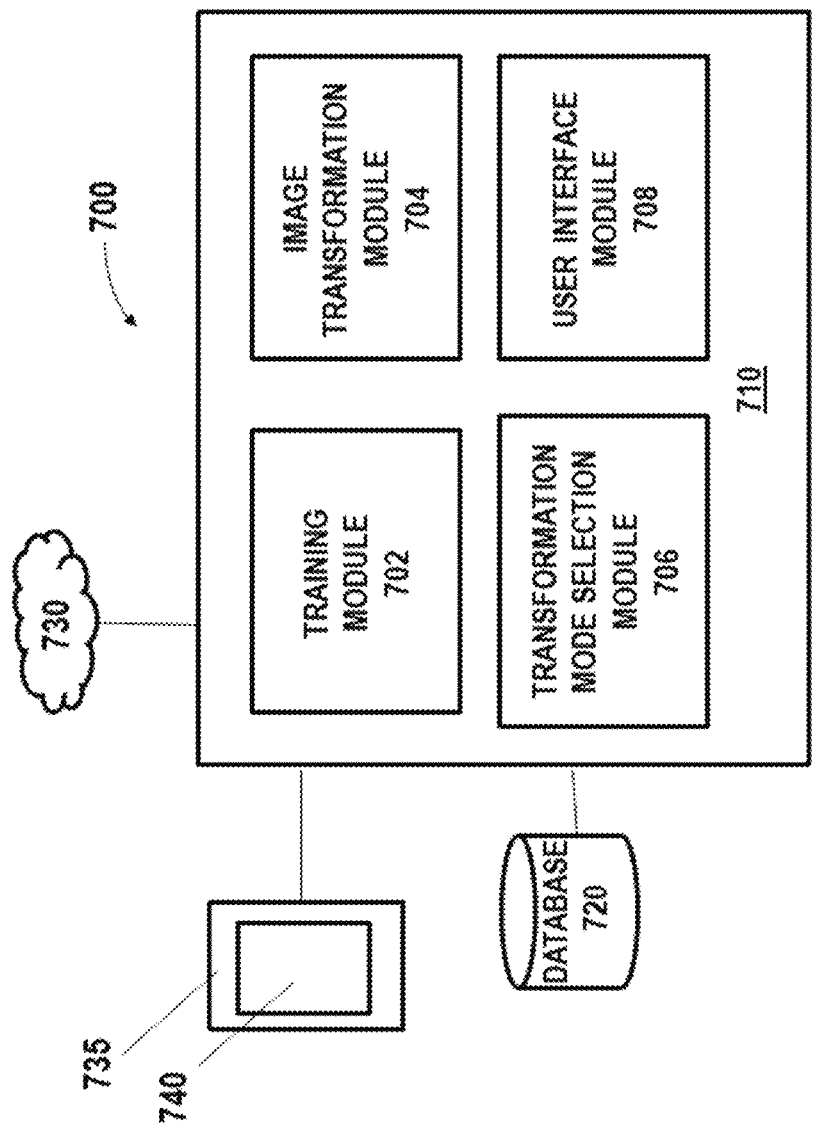
FIG. 7 shows a block diagram of an example of MR imaging standardization system, in accordance with some embodiments of the present disclosure.

FIG. 7 shows a block diagram of an example of MR imaging standardization system 700, in accordance with embodiments of the present disclosure. The MR imaging standardization system 700 may comprise a system 710 for training a deep learning network model and inference. The system 710 can be the same as the system as described in FIG. 1. The system 710 may comprise multiple components, including but not limited to, a training module 702, an image transformation module 704, a transformation mode selection module 706 and a user interface module 708.

The training module 702 may be configured to collect and manage training datasets. The training module 702 may comprise a deep learning algorithm such as convolutional neural network (CNN). The training module may be configured to implement the machine learning methods as described above. The training module may train a model off-line or off-site. Alternatively or additionally, the training module may use real-time data as feedback to refine the model. One or more trained network models may be stored in a database 720.

The image transformation module 704 may be configured to transform images to a target style using a network model that is trained by the training module. The image transform module may take one or more k-space images or MR image data from one or more scanners of the same or different types as input, and output MR image data with the target style. In some embodiments, the image transform module may be in communication with the database 720 such that upon determining a target style or transformation mode, a corresponding network model may be retrieved from the database 720.

The transformation mode selection module 706 may be operably coupled to the image transformation module and/or the user interface module 708. The transformation mode selection module 706 may be configured to determine a transformation mode. The transformation mode may define the target style/form and/or one or more characteristics of a target style/form. A transformation mode may be determined automatically or manually. In some cases, the transformation mode selection module 706 may automatically load to the system a target style that is pre-determined or pre-selected. In some cases, the transformation mode selection module 706 may analyze the input the image data and automatically determine a transformation mode or target style. The target style or transformation mode may be determined based on predetermined rule(s). For instance, the target style may be determined based on an optimal quality of the output image. For instance, when the input image data comprise data collected from two different types of scanners, the target style may be determined to be the same as the style that has a higher resolution or better contrast.

In some case, the transformation mode selection module 706 may allow a user to select a target style or one or more characteristics of a target style. For example, a user may be permitted to select a target style or specify one or more characteristics of a target style. In response to determining a target style, the transformation mode selection module 706 may notify the image transformation module 704 for obtaining the corresponding network model. In some cases, the transformation mode selection module 706 may receive a user input indicating a desired standard form or target form (e.g., standard style, a given vendor's style, image resolution, field of view; color, contrast, etc). The transformation mode selection module 706 may be operably coupled to the user interface module 708 for receiving user input and outputting a selected transformation mode or target style.

The user interface module 708 may render a graphical user interface (GUI) 740 allowing a user to select a transformation mode, a target style or one or more characteristics of a target style, viewing information related to image transformation settings and the like. The GUI may show graphical elements that permit a user to view or access information related to image standardization. A graphical user interface can have various interactive elements such as buttons, text boxes and the like, which may allow a user to provide input commands or contents by directly typing, clicking or dragging such interactive elements. For example, a user may input, via a user interface, a target style. The target style may be provided via any suitable formats on a GUI, such as a selection from drop-down menu (e.g., standard style, transformation mode, a vendor list, etc), direct input in a search field (e.g., input name of a vendor) or via other suitable means such as voice command and the like.

In some cases, the graphical user interface (GUI) or user interface may be provided on a display 735. The display may or may not be a touchscreen. The display may be a light-emitting diode (LED) screen, organic light-emitting diode (OLED) screen, liquid crystal display (LCD) screen, plasma screen, or any other type of screen. The display may be configured to show a user interface (UI) or a graphical user interface (GUI) rendered through an application (e.g., via an application programming interface (API) executed on the local computer system or on the cloud).

The imaging standardization system 700 may be implemented in software, hardware, firmware, embedded hardware, standalone hardware, application specific-hardware, or any combination of these. The imaging standardization system, modules, components, algorithms and techniques may include implementation in one or more computer programs that are executable and/or interpretable on a programmable system including at least one programmable processor, which may be special or general purpose, coupled to receive data and instructions from, and to transmit data and instructions to, a storage system, at least one input device, and at least one output device. These computer programs (also known as programs, software, software applications, or code) may include machine instructions for a programmable processor, and may be implemented in a high-level procedural and/or object-oriented programming language, and/or in assembly/machine language. As used herein, the terms "machine-readable medium" and "computer-readable medium" refer to any computer program product, apparatus, and/or device (such as magnetic discs, optical disks, memory, or Programmable Logic Devices (PLDs)) used to provide machine instructions and/or data to a programmable processor. The imaging standardization system can be a standalone system that is separate from the MR imaging system. Alternatively or in addition to, the imaging standardization system can be integral to the MR imaging system such as a component of a controller of the MR imaging system.

The imaging standardization system 700 may comprise computer systems for implementing the system 710 and database systems 720. The computer system can comprise a laptop computer, a desktop computer, a central server, distributed computing system, etc. The processor may be a hardware processor such as a central processing unit (CPU), a graphic processing unit (GPU), a general-purpose processing unit, which can be a single core or multi core processor, a plurality of processors for parallel processing, in the form of fine-grained spatial architectures such as a field programmable gate array (FPGA), an application-specific integrated circuit (ASIC), and/or one or more Advanced RISC Machine (ARM) processors. The processor can be any suitable integrated circuits, such as computing platforms or microprocessors, logic devices and the like. Although the disclosure is described with reference to a processor, other types of integrated circuits and logic devices are also applicable. The processors or machines may not be limited by the data operation capabilities. The processors or machines may perform 512 bit, 256 bit, 128 bit, 64 bit, 32 bit, or 16 bit data operations.

The imaging standardization system 700 may comprise one or more databases. The one or more databases 720 may utilize any suitable database techniques. For instance, structured query language (SQL) or "NoSQL" database may be utilized for storing MR image data, raw image data, synthesized reference image data, training datasets, trained model, target style, characteristics of a style or form, etc. Some of the databases may be implemented using various standard data-structures, such as an array, hash, (linked) list, struct, structured text file (e.g., XML), table, JSON, NOSQL and/or the like. Such data-structures may be stored in memory and/or in (structured) files. In another alternative, an object-oriented database may be used. Object databases can include a number of object collections that are grouped and/or linked together by common attributes: they may be related to other object collections by some common attributes. Object-oriented databases perform similarly to relational databases with the exception that objects are not just pieces of data but may have other types of functionality encapsulated within a given object. If the database of the present disclosure is implemented as a data-structure, the use of the database of the present disclosure may be integrated into another component such as the component of the present invention. Also, the database may be implemented as a mix of data structures, objects, and relational structures. Databases may be consolidated and/or distributed in variations through standard data processing techniques. Portions of databases, e.g., tables, may be exported and/or imported and thus decentralized and/or integrated.

The network 730 may establish connections among various components in a MRI system and a connection of the imaging standardization system to external systems (e.g., databases, servers. MRI systems, etc). The network 730 may comprise any combination of local area and/or wide area networks using both wireless and/or wired communication systems. For example, the network 730 may include the Internet, as well as mobile telephone networks. In one embodiment, the network 730 uses standard communications technologies and/or protocols. Hence, the network 730 may include links using technologies such as Ethernet. 802.11, worldwide interoperability for microwave access (WiMAX), 2G/3G/4G mobile communications protocols, asynchronous transfer mode (ATM). InfiniBand. PCI Express Advanced Switching, etc. Other networking protocols used on the network 730 can include multiprotocol label switching (MPLS), the transmission control protocol/Internet protocol (TCP/IP), the User Datagram Protocol (UDP), the hypertext transport protocol (HTTP), the simple mail transfer protocol (SMTP), the file transfer protocol (FTP), and the like. The data exchanged over the network can be represented using technologies and/or formats including image data in binary form (e.g., Portable Networks Graphics (PNG)), the hypertext markup language (HTML), the extensible markup language (XML), etc. In addition, all or some of links can be encrypted using conventional encryption technologies such as secure sockets layers (SSL), transport layer security (TLS), Internet Protocol security (IPsec), etc. In another embodiment, the entities on the network can use custom and/or dedicated data communications technologies instead of, or in addition to, the ones described above.

Whenever the term "at least," "greater than," or "greater than or equal to" precedes the first numerical value in a series of two or more numerical values, the term "at least," "greater than" or "greater than or equal to" applies to each of the numerical values in that series of numerical values. For example, greater than or equal to 1, 2, or 3 is equivalent to greater than or equal to 1, greater than or equal to 2, or greater than or equal to 3.

Whenever the term "no more than," "less than," or "less than or equal to" precedes the first numerical value in a series of two or more numerical values, the term "no more than," "less than," or "less than or equal to" applies to each of the numerical values in that series of numerical values. For example, less than or equal to 3, 2, or 1 is equivalent to less than or equal to 3, less than or equal to 2, or less than or equal to 1.

As used herein A and/or B encompasses one or more of A or B, and combinations thereof such as A and B. It will be understood that although the terms "first," "second." "third" etc. are used herein to describe various elements, components, regions and/or sections, these elements, components, regions and/or sections should not be limited by these terms. These terms are merely used to distinguish one element, component, region or section from another element, component, region or section. Thus, a first element, component, region or section discussed herein could be termed a second element, component, region or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising." or "includes" and/or "including," when used in this specification, specify the presence of stated features, regions, integers, steps, operations, elements and/or components, but do not preclude the presence or addition of one or more other features, regions, integers, steps, operations, elements, components and/or groups thereof.

Reference throughout this specification to "some embodiments," or "an embodiment," means that a particular feature, structure, or characteristic described in connection with the embodiment is included in at least one embodiment. Thus, the appearances of the phrase "in some embodiment," or "in an embodiment," in various places throughout this specification are not necessarily all referring to the same embodiment. Furthermore, the particular features, structures, or characteristics may be combined in any suitable manner in one or more embodiments.

While preferred embodiments of the present invention have been shown and described herein, it will be obvious to those skilled in the art that such embodiments are provided by way of example only. It is not intended that the invention be limited by the specific examples provided within the specification. While the invention has been described with reference to the aforementioned specification, the descriptions and illustrations of the embodiments herein are not meant to be construed in a limiting sense. Numerous variations, changes, and substitutions will now occur to those skilled in the art without departing from the invention. Furthermore, it shall be understood that all aspects of the invention are not limited to the specific depictions, configurations or relative proportions set forth herein which depend upon a variety of conditions and variables. It should be understood that various alternatives to the embodiments of the invention described herein may be employed in practicing the invention. It is therefore contemplated that the invention shall also cover any such alternatives, modifications, variations or equivalents. It is intended that the following claims define the scope of the invention and that methods and structures within the scope of these claims and their equivalents be covered thereby.

What is claimed is:

1. A computer-implemented method for standardizing medical imaging, the method comprising:
    acquiring one or more input images using one or more imaging devices, wherein the one or more imaging devices are of a same imaging modality and the one or more imaging devices correspond to one or more different image styles;
    determining a standardized image style for processing the one or more input images;
    predicting a synthesized output image by processing the one or more input images using a deep network model, wherein the synthesized output image has the standardized image style; and
    displaying the synthesized output image with the standardized image style on a display device.

2. The computer-implemented method of claim 1, wherein the standardized image style is determined by a user via a graphical user interface (GUI) rendered on the display device.

3. The computer-implemented method of claim 2, wherein the standardized image style is determined by the user selecting an image style from a list of image styles.

4. The computer-implemented method of claim 1, wherein the standardized image style is determined automatically based at least in part on the one or more input images.

5. The computer-implemented method of claim 1, wherein the standardized image style comprises one or more characteristics including contrast, resolution, size, color, or image distortion.

6. The computer-implemented method of claim 1, wherein the one or more imaging devices are magnetic resonance (MR) devices and are provided by one or more different vendors.

7. The computer-implemented method of claim 1, wherein the one or more different image styles are different in at least one of contrast, resolution and image distortion.

8. The computer-implemented method of claim 1, wherein the deep network model is trained using a combination of unsupervised learning and supervised learning.

9. The computer-implemented method of claim 8, wherein the combination of unsupervised learning and supervised learning comprises training the deep network model using supervised training approach and further enhancing the deep network model using an unsupervised training approach.

10. The computer-implemented method of claim 8, wherein the combination of unsupervised learning and supervised learning comprises using a combination of supervised loss and unsupervised loss.

11. A non-transitory computer-readable storage medium including instructions that, when executed by one or more processors, cause the one or more processors to perform operations comprising:
   acquiring one or more input images using one or more imaging devices, wherein the one or more imaging devices are of a same imaging modality and the one or more imaging devices correspond to one or more different image styles;
   determining a standardized image style for processing the one or more input images;
   predicting a synthesized output image by processing the one or more input images using a deep network model, wherein the synthesized output image has the standardized image style; and
   displaying the synthesized output image with the standardized image style on a display device.

12. The non-transitory computer-readable storage medium of claim 11, wherein the standardized image style is determined by a user via a graphical user interface (GUI) rendered on the display device.

13. The non-transitory computer-readable storage medium of claim 12, wherein the standardized image style is determined by the user selecting an image style from a list of image styles.

14. The non-transitory computer-readable storage medium of claim 11, wherein the standardized image style is determined automatically based at least in part on the one or more input images.

15. The non-transitory computer-readable storage medium of claim 11, wherein the standardized image style comprises one or more characteristics including contrast, resolution, size, color, or image distortion.

16. The non-transitory computer-readable storage medium of claim 11, wherein the one or more imaging devices are magnetic resonance (MR) devices and are provided by one or more different vendors.

17. The non-transitory computer-readable storage medium of claim 11, wherein the one or more different image styles are different in at least one of contrast, resolution and image distortion.

18. The non-transitory computer-readable storage medium of claim 11, wherein the deep network model is trained using a combination of unsupervised learning and supervised learning.

19. The non-transitory computer-readable storage medium of claim 18, wherein the combination of unsupervised learning and supervised learning comprises training the deep network model using supervised training approach and further enhancing the deep network model using an unsupervised training approach.

20. The non-transitory computer-readable storage medium of claim 18, wherein the combination of unsupervised learning and supervised learning comprises using a combination of supervised loss and unsupervised loss.

* * * * *